United States Patent
Nguyen et al.

(10) Patent No.: US 9,077,330 B2
(45) Date of Patent: *Jul. 7, 2015

(54) SERIALIZER CIRCUITRY FOR HIGH-SPEED SERIAL DATA TRANSMITTERS ON PROGRAMMABLE LOGIC DEVICE INTEGRATED CIRCUITS

(71) Applicant: Altera Corporation, San Jose, CA (US)

(72) Inventors: Toan Thanh Nguyen, San Jose, CA (US); Thungoc M. Tran, San Jose, CA (US); Sergey Shumarayev, San Leandro, CA (US); Arch Zaliznyak, San Jose, CA (US); Shoujun Wang, Ottawa (CA); Ramanand Venkata, San Francisco, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 14/022,639

(22) Filed: Sep. 10, 2013

(65) Prior Publication Data

US 2014/0009188 A1 Jan. 9, 2014

Related U.S. Application Data

(60) Continuation of application No. 12/953,766, filed on Nov. 24, 2010, now Pat. No. 8,570,197, which is a division of application No. 11/364,589, filed on Feb. 27, 2006, now Pat. No. 7,848,318.

(60) Provisional application No. 60/707,615, filed on Aug. 12, 2005, provisional application No. 60/705,682, filed on Aug. 3, 2005.

(51) Int. Cl.
*H03M 9/00* (2006.01)
*H03K 19/00* (2006.01)

(Continued)

(52) U.S. Cl.
CPC .............. *H03K 19/00* (2013.01); *H04L 7/0008* (2013.01); *H04L 7/033* (2013.01); *H04L 25/0266* (2013.01); *H04L 1/243* (2013.01); *H03K 19/17744* (2013.01); *H03M 9/00* (2013.01)

(58) Field of Classification Search
CPC ....... H03M 9/00; H04L 7/0008; H04L 7/033; H04L 25/0266; H04L 1/243; H03K 19/23; H03K 19/17728; H03K 19/17736; G06F 1/10; H04Q 11/04
USPC .......... 341/101, 100; 375/354, 375, 220, 221; 326/36, 37, 38, 41; 327/293; 370/366
See application file for complete search history.

(56) References Cited

U.S. PATENT DOCUMENTS

| | | |
|---|---|---|
| 4,446,534 A | 5/1984 | Smith |
| 5,689,195 A | 11/1997 | Cliff et al. |

(Continued)

FOREIGN PATENT DOCUMENTS

| | | |
|---|---|---|
| EP | 1 482 642 | 12/2004 |
| JP | 2001-078468 | 3/2001 |

*Primary Examiner* — Joseph Lauture
(74) *Attorney, Agent, or Firm* — Ropes & Gray LLP; Jeffrey H. Ingerman

(57) ABSTRACT

Serializer circuitry for high-speed serial data transmitter circuitry on a programmable logic device ("PLD") or the like includes circuitry for converting parallel data having any of several data widths to serial data. The circuitry can also operate at any frequency in a wide range of frequencies, and can make use of reference clock signals having any of several relationships to the parallel data rate and/or the serial data rate. The circuitry is configurable/re-configurable in various respects, at least some of which configuration/re-configuration can be dynamically controlled (i.e., during user-mode operation of the PLD).

20 Claims, 3 Drawing Sheets

(51) Int. Cl.
  *H03K 19/177* (2006.01)
  *H04L 7/00* (2006.01)
  *H04L 7/033* (2006.01)
  *H04L 25/02* (2006.01)
  *H04L 1/24* (2006.01)

(56) References Cited

U.S. PATENT DOCUMENTS

| | | |
|---|---|---|
| 5,726,651 A | 3/1998 | Belot |
| 5,726,990 A | 3/1998 | Shimada et al. |
| 5,909,126 A | 6/1999 | Cliff et al. |
| 6,215,326 B1 | 4/2001 | Jefferson et al. |
| 6,407,576 B1 | 6/2002 | Ngai et al. |
| 6,459,393 B1 | 10/2002 | Nordman |
| 6,629,256 B1 | 9/2003 | Ilan et al. |
| 6,650,140 B2 | 11/2003 | Lee et al. |
| 6,766,411 B2 | 7/2004 | Goldshlag |
| 6,834,367 B2 | 12/2004 | Bonneau et al. |
| 7,058,120 B1 | 6/2006 | Lu et al. |
| 7,106,227 B2 | 9/2006 | Karlquist |
| 7,116,251 B1 | 10/2006 | Groen et al. |
| 7,227,918 B2 | 6/2007 | Aung et al. |
| 7,304,498 B2 | 12/2007 | Bereza et al. |
| 7,324,564 B2 | 1/2008 | Wu et al. |
| 7,336,673 B2 | 2/2008 | Ilnicki et al. |
| 7,848,318 B2 * | 12/2010 | Nguyen et al. ............... 370/366 |
| 8,570,197 B2 * | 10/2013 | Nguyen et al. ............... 341/101 |
| 2007/0240009 A1 | 10/2007 | Yanagawa |

* cited by examiner

SERIALIZER CIRCUITRY FOR HIGH-SPEED SERIAL DATA TRANSMITTERS ON PROGRAMMABLE LOGIC DEVICE INTEGRATED CIRCUITS

This is a continuation of, commonly-assigned U.S. patent application Ser. No. 12/953,766, filed Nov. 24, 2010, now U.S. Pat. No. 8,570,197, which is a division of U.S. patent application Ser. No. 11/364,589, filed Feb. 27, 2006, now U.S. Pat. No. 7,848,318, and claimed the benefit of, U.S. Provisional Patent Application No. 60/705,682, filed Aug. 3, 2005, and U.S. Provisional Patent Application No. 60/707,615, filed Aug. 12, 2005, each of which is hereby incorporated by reference herein in its respective entirety.

BACKGROUND OF THE INVENTION

This invention relates to programmable logic devices ("PLDs") and other integrated circuits of that general type (all generically referred to for convenience as PLDs). More particularly, the invention relates to high-speed serial data transmitter circuitry for inclusion on PLDs.

PLDs are intended to be relatively general-purpose devices. A PLD can be programmed (configured) and/or otherwise controlled to meet any need within the range of needs that the PLD is designed to support. A PLD may be equipped with high-speed serial data communication circuitry, whereby the PLD can transmit serial data to and/or receive serial data from circuitry that is external to the PLD. In that case, it is desirable for the high-speed serial data communication circuitry of the PLD to be able to support various communication protocols that various users of the PLD product may wish to employ.

In the case of high-speed serial data transmitter circuitry on a PLD, one of the tasks that such circuitry typically needs to perform is serialization of data from the parallel form in which it is typically generated and/or handled in the core logic circuitry of the PLD to the serial form in which the transmitter transmits it off the PLD. This invention provides serializer circuitry that can perform this task for a number of different communication protocols and over a wide range of possible data rates. An illustrative range of data rates that circuitry in accordance with this invention can support is 622 Mbps (mega-bits per second) to 6.5 Gbps (giga-bits per second). This range is only an example, however, and it will be understood that other embodiments of the invention can support other data rate ranges if desired.

SUMMARY OF THE INVENTION

In accordance with the invention, high-speed serial data transmitter circuitry on a PLD includes serializer circuitry that can convert parallel data having any of several data widths to serial data. For example, the serializer circuitry may be able to convert to serial form parallel data that is presented 20 bits at a time, 16 bits at a time, 10 bits at a time, or 8 bits at a time. The serializer circuitry is also preferably able to operate at any frequencies and/or data rates in a fairly wide range. The serializer circuitry also preferably has the ability to operate with reference clock signals having any of several frequency relationships to the frequencies and/or data rates used internally in the serializer. Multiple serializer channels may be provided, and these may be operated independently (or relatively independently) of one another, or they may be synchronized with one another. The serializer circuitry is preferably configurable and re-configurable in various respects, which may include dynamic configuration/re-configuration (i.e., during user-mode operation of the PLD).

Further features of the invention, its nature and various advantages, will be more apparent from the accompanying drawings and the following detailed description.

DETAILED DESCRIPTION

Figure 1:
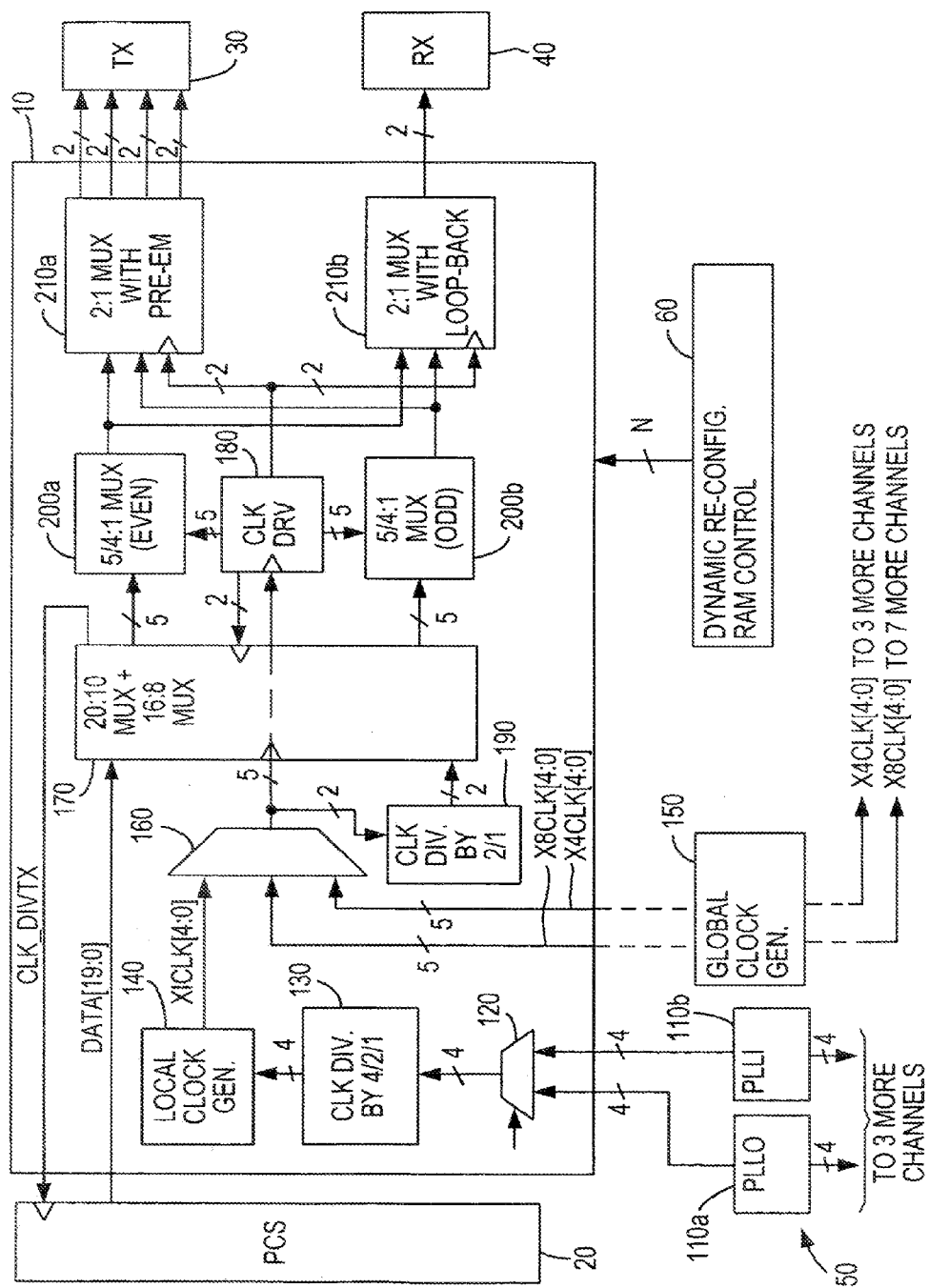
FIG. 1 is a simplified schematic block diagram of an illustrative embodiment of circuitry constructed in accordance with the invention.

An illustrative embodiment of data serializer circuitry 10 constructed in accordance with the invention is shown in FIG. 1. By way of an introductory over-view, everything shown in FIG. 1 is part of the circuitry of a PLD. Serializer 10 receives parallel data from physical coding sublayer ("PCS") circuitry 20 of the PLD, and it applies that data in serial form to transmitter output circuitry 30 of the PLD. Serializer 10 also applies the serial data output to high-speed serial data receiver circuitry 40 of the PLD. (This is a so-called loop-back connection for the serial data, which is provided for test purposes.)

Serializer 10 is typically only one of a plurality of similar circuits (channels or transmitter channels) on the PLD. Several of these channels may be associated with clock management unit ("CMU") circuitry 50. For example, four channels 10 may be associated with each CMU 50, and there may be eight (or more) channels 10 on the PLD. Various aspects of the operation of each channel 10 may be controlled by output signals of dynamic random access memory ("RAM") circuitry 60 on the PLD. The RAM bits of circuitry 60 can be changed at any time, thereby changing the parameters of the functions in channel 10 that are controlled by those changed RAM bits.

In the illustrative embodiment shown in FIG. 1, serializer 10 can handle data output by PCS 20 in any of several different parallel data widths and at any data rate in a wide range of such rates. For example, the width of the parallel data output by PCS 20 can be 8, 10, 16, or 20 bits, and the serial bit rate (for serial data output by elements 210) may be any rate in the range from about 622 Mbps to about 6.5 Gbps. This flexibility allows the circuitry to support any of a number of different communication standards or protocols. Whatever the parallel data width employed, PCS 20 outputs that parallel data on each rising edge of the CLK_DIVTX signal.

It may be worth explaining at this relatively early point why serializer 10 is shown outputting eight signals in parallel to TX circuitry 30. This is because the same serial data output signal is being output with four different phases, with each phase being a differential signal pair. Each phase is separated by one unit interval ("UI") of the serial data signal (i.e., the time duration of one bit in the serial data signal). This is done to help TX circuitry 30 give pre-emphasis to the serial data signal that is ultimately output by the PLD. See, for example, Tran et al. U.S. Pat. No. 7,355,449 for more information about this type of pre-emphasis of a serial data output signal. The serial data signal applied to receiver circuitry 40 is also a differential signal pair.

In the illustrative embodiment shown in FIG. 1, each CMU 50 includes two phase-locked loop ("PLL") circuits 110a and 110b. Each PLL circuit 110 can receive a reference clock signal and can use that signal to produce four further clock signals. The four clock signals output by each PLL 110 are all phase-shifted replicas of the same signal (i.e., at 0°, 90°, 180°, and 270° phase shift, respectively.) For example, for a particular communication protocol, the reference clock signal applied to one of PLLs 110 may have a frequency of 156.25 MHz, and the PLL may output clock signals having a frequency of 3.125 GHz. (As will become more apparent as the discussion proceeds, the illustrative embodiment being discussed includes half-rate capability which can clock serial data on both edges of a clock signal. Accordingly, the just-mentioned example of a 3.125 Ghz clock signal can support a serial data rate of 6.25 Gbps.)

Within each channel 10 associated with CMU 50, multiplexer ("mux") circuitry 120 allows that channel to select either the output signals of PLL 110a or the output signals of PLL 110b for possible further use in the channel. The selection made by mux 120 is one of the functions of channel 10 that can be controlled by circuitry 60.

The clock signals selected by mux 120 are applied to frequency divider circuitry 130. Circuitry 130 can divide the frequency of each clock signal applied to it by 4, 2, or 1 (effectively a bypass of frequency division). The frequency division factor employed by circuitry 130 is another of the functions of channel 10 that can be controlled by circuitry 60. Frequency division by circuitry 130 may be used when various channels are operating at different data rates. Consider, for example, a case in which channel "1" and channel "0" use the same clock source, but channel "1" operates at 6.5 Gbps and channel "0" operates at 3.25 Gbps. In such a case, the clock in channel "0" must be divided by 2, which is done by the circuitry 130 of channel "0".

The output signals of circuitry 130 are applied to local clock generator circuitry 140. Circuitry 140 uses the signals it receives to produce further clock signals for possible use in the parallel-to-serial converter components of channel 10. The signals produced by circuitry 140 may be either used directly in the parallel-to-serial components, or they may be close precursors of signals that are thus used. For example, the output signals of circuitry 140 may include a pair of high frequency clock signals that have a 180° phase shift between them. These high frequency clock signals may be at one-half the ultimate serial bit rate (because these two signals together can be used to effectively double the serial bit rate as compared to the high frequency clock signal frequency). Thus in the previously mentioned example, high frequency clocks at 3.125 Ghz can be used to provide a serial data rate of 6.25 Gbps. These two high frequency clock signals may be referred to as HFCLK_P and HFCLK_N.

Circuitry 140 may also produce a pair of low frequency clock signals that again have a 180° phase shift between them. These low frequency clock signals may be at one-fifth (20/10 bit mode) or one-quarter (16/8 bit mode) the frequency of the HFCLK signals. These low frequency clocks may be referred to as LFCLK_P and LFCLK_N. (The fifth output signal of circuitry 140 is a CPULSE signal having the same frequency as LFCLK but only a 20% duty cycle when dividing by 5 or a 25% duty cycle when dividing by 4.) It will thus be apparent that circuitry 140 includes clock divider circuitry that divides the PLL clocks further down in order to produce some of the clocks that it sends to other components of channel 10. The frequency division applied by circuitry 140 (i.e., whether division by 5 or division by 4) is another of the functions of channel 10 that can be controlled by circuitry 60.

Global clock generator circuitry 150 is not part of channel 10. Circuitry 150 is similar to circuitry 140, but rather than producing output signals that are only usable in one channel 10, circuitry 150 produces two sets of output signals—one set that is usable in as many as four channels 10 (e.g., the four channels associated with one CMU 50), and another set that is usable in as many as eight channels 10 (e.g., the eight channels associated with two CMUs 50). Note in this connection that the output signals of both PLLs 110 in a CMU are applied to the mux 120 in each channel 10 associated with that CMU. The X4CLK[4:0] output signals of circuitry 150 are also applied to all four channels 10 associated with a CMU 50. The X8CLK[4:0] output signals of circuitry 150 are applied to all eight channels 10 associated with two CMUs 50. Circuitry 150 may operate on output signals of a selected (or selectable) one of the PLLs 110 of one or more CMUs 50.

Within each channel 10, mux circuitry 160 allows selection of the X1CLK[4:0] output signals of the local clock generator circuitry 140 in that channel, the X4CLK[4:0] output signals of global clock generator circuitry 150, or the X8CLK[4:0] output signals of global clock generator circuitry 150. Accordingly, this arrangement allows each channel 10 to operate relatively independently (use of X1CLK signals), to operate together with as many as three other channels 10 (use of X4CLK signals), or to operate together with as many as seven other channels 10 (use of X8CLK signals), depending on the requirements of the communication protocol and application being implemented. Channels that are used together may be referred to as synchronized channels. The selections made by mux 160 are another of the functions of channel 10 that can be controlled by circuitry 60.

From the foregoing, it will be seen that clock multiplexer circuitry 160 can select a different clock source, depending on the desired operating mode of channel 10. For single-channel mode, mux 160 selects X1CLK[4:0], whereby channel 10 operates at its own independent data rate. For four-channel mode, mux 160 selects X4CLK[4:0], whereby as many as four channels associated with CMU 50 share the same clocks so that they are synchronized and operate at the same data rate. For eight-channel mode, mux 160 selects X8CLK[4:0], whereby as many as eight channels share the same clocks so that they are synchronized and operate at the same data rate.

The output signals of mux 160 are applied to mux circuitry 170, to clock driver circuitry 180, and (in the case of the low frequency clock signals LFCLK_P and LFCLK_N) to frequency divider circuitry 190.

Circuitry 190 optionally divides the frequency of the low frequency clock signals by 2. This frequency division is used when PCS 20 is supplying parallel data in 20-bit mode or 16-bit mode. If PCS 20 is supplying parallel data in 10-bit mode or 8-bit mode, the low frequency clock signals bypass division by 2 in circuitry 190. Whether or not there is frequency division by 2 in circuitry 190 is another function of channel 10 that can be controlled by circuitry 60.

The output signals of circuitry 190 are the low frequency clock signals applied to multiplexer circuitry 170. These are the signals that control intake of parallel data from PCS 20. Their frequency (or attributes of their frequency) correspond to the rate at which PCS 20 outputs parallel data. Mux circuitry 170 also includes circuitry (or at least routing) for deriving above-mentioned signal CLK_DIVTX from the low frequency clock signals output by circuitry 190. As noted earlier, PCS 20 outputs parallel data (whether 8 bits, 10 bits, 16 bits, or 20 bits) on each rising edge of CLK_DIVTX.

Clock driver circuitry 180 drives and balances the central clocks for the rest of serializer 10. The nature of the output signals of circuitry 180 will be apparent from the further discussion below.

Multiplexer circuitry 170 serializes 20 parallel data bits to two successive groups of 10 parallel bits if the circuitry is operating in 20-bit mode (i.e., if PCS 20 is outputting 20 parallel bits). Alternatively, if the circuitry is operating in 16-bit mode (i.e., if PCS 20 is outputting 16 parallel bits), mux circuitry 170 serializes 16 parallel bits to two successive groups of 8 parallel bits. As still another alternative, for 10-bit mode and 8-bit mode (i.e., PCS 20 outputting 10 parallel bits or 8 parallel bits), the data just flows through synchronized registers of mux circuitry 170. In other words, 10 parallel input bits flow through to 10 parallel output bits, or 8 parallel input bits flow through to 8 parallel output bits. The clock signals applied to mux circuitry 170 from circuitry 190 clock register circuitry on the input side of circuitry 170. The clock signals applied to circuitry 170 from circuitry 180 clock register circuitry on the output side of circuitry 170. From the earlier discussion of circuitry 170 it will be apparent that in 20-bit mode and 16-bit mode the output register circuitry of circuitry 170 must be clocked at twice the rate that the input register circuitry of circuitry 170 must be clocked. This is the reason for division by 2 in circuitry 190. On the other hand, in 10-bit mode and 8-bit mode, the input and output register circuitries of circuitry 170 must be clocked at the same rate. This is the reason for the option to bypass frequency division by circuitry 190. Selection of how signals will be routed (e.g., from input to output) in circuitry 170 is another function of channel 10 that can be controlled by circuitry 60. In particular, circuitry 170 is single/double width mux circuitry. Circuitry 60 can control circuitry 170 to either select its double-width mode (20/16 bit mode) or its single-width mode (10/8 bit mode).

The bits in even-numbered bit positions in the output of circuitry 170 are applied in parallel to multiplexer circuitry 200*a*. This can be as many as five bits in 20-bit or 10-bit mode, or it may be only four bits in 16-bit or 8-bit mode. The bits in odd-numbered bit positions in the output of circuitry 170 are applied in parallel to multiplexer circuitry 200*b*. Again, this can be five bits or four bits, with the same mode-dependency as for circuitry 200*a*.

The clock signals applied to mux circuits 200 (from clock driver circuitry 180) cause each of circuits 200 to output its five or four bits, one at a time, one after another, at one-half the ultimate serial data bit rate. Each of circuits 200 therefore converts the five or four bits that it receives in parallel form to serial form. Selection of how many bit positions each of circuits 200 will output from is another function of channel 10 that can be controlled by circuitry 60.

The single bit outputs of circuits 200*a* and 200*b* are applied in parallel to each of multiplexer circuits 210*a* and 210*b*. Each of these circuits uses the clock signals applied to it (from circuitry 180) to alternately select its two input signals to be its output signal. This selection alternates at the ultimate serial data output bit rate of channel 10. Accordingly, each of circuits 210*a* and 210*b* is basically a two-to-one multiplexer for converting each applied pair of data bits from parallel to serial form. In addition, each of circuits 210*a* and 210*b* converts the typically single-ended serial output signal to a differential signal pair. Circuitry 210*a* also stores the four most recent serial output bits and applies them in parallel (and in differential form) to four stages of output pre-driver and driver circuitry in TX circuitry 30 (e.g., as shown in the above-mentioned Tran et al. reference). As was mentioned earlier, this is done to help TX circuitry 30 give the final serial data output signal various kinds of pre-emphasis, if that is desired. Circuitry 210*b* applies its differential, serial data output signals to receiver circuitry 40 as a loop-back signal for test purposes as described earlier in this specification.

Figure 2:
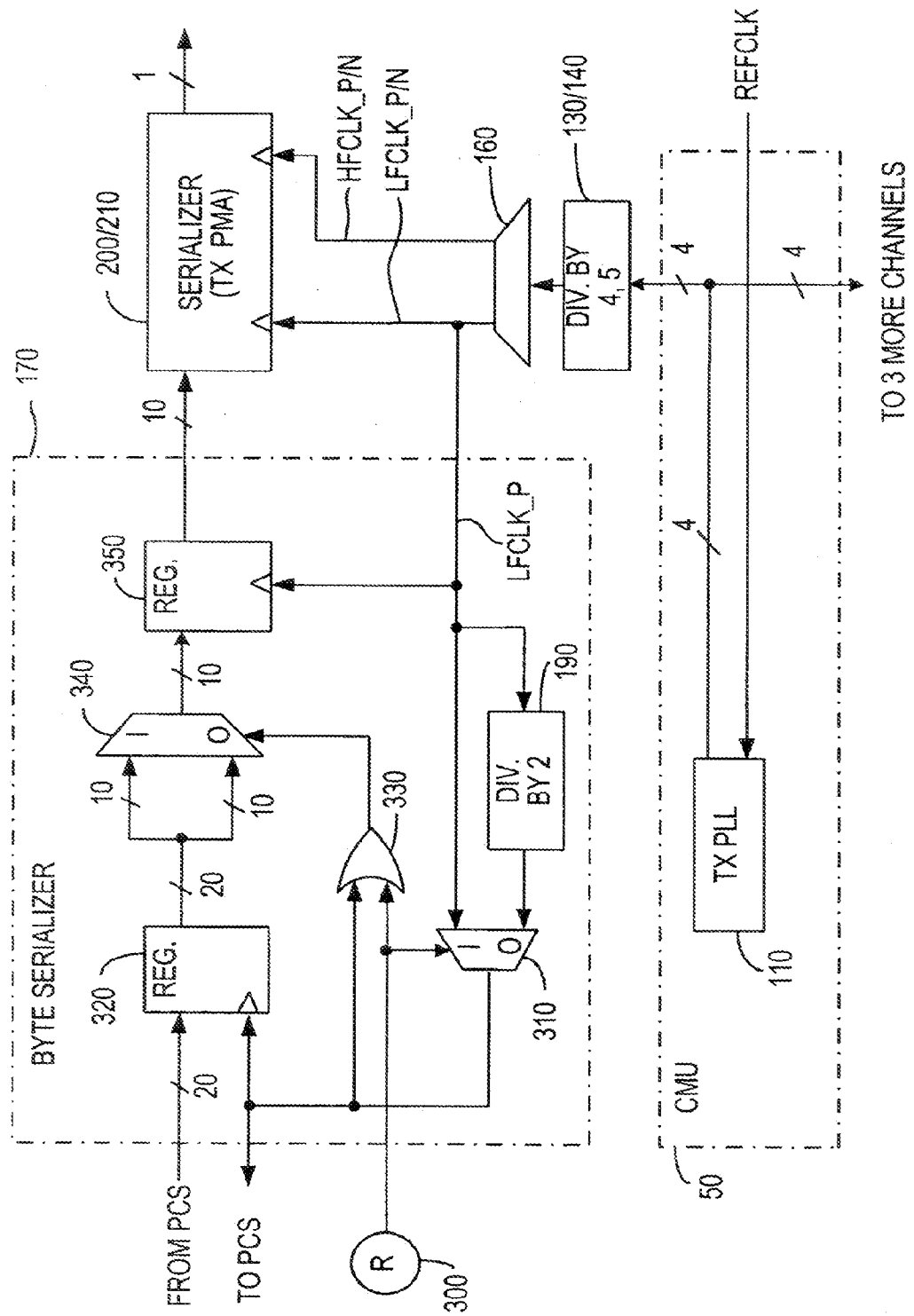
FIG. 2 is a simplified schematic block diagram of an illustrative embodiment of certain aspects of FIG. 1 in somewhat more detail in accordance with the invention.

FIG. 2 shows an illustrative embodiment of a portion of FIG. 1 in somewhat more detail. FIG. 2 shows a REFCLK signal being applied to representative TX PLL 110 in CMU 50 as described earlier. The four, phase-distributed (or phase-quadrature) output signals of PLL 110 are applied to circuitry 130/140, which may include frequency division by 4 or 5. Division by 4 is used for 16-bit mode and 8-bit mode. Division by 5 is used for 20-bit mode and 10-bit mode. HFCLK_P and HFCLK_N are output signals of circuitry 130/140 that have not been subjected to this frequency division by 4 or 5. LFCLK_P and LFCLK_N are output signals of circuitry 130/140 that have been subjected to this frequency division by 4 or 5. Accordingly, the frequency of the HFCLK signals is 4 or 5 times greater than the frequency of the LFCLK signals. The LFCLK signals are used on the parallel input side of final serializer circuitry 200/210. The HFCLK signals are used on the serial output side of that circuitry.

The LFCLK_P output signal of circuitry 130/140 is also applied to output register 350 of byte serializer 170, to one selectable input terminal of mux 310, and to divide by 2 frequency divider circuitry 190. The output signal of circuitry 190 is applied to the other selectable input terminal of mux 310. The input selection made by mux 310 is controlled by memory bit 300, which can be part of circuitry 60 in FIG. 1. The output of memory bit 300 is also applied to one input terminal of OR gate 330. The output signal of memory bit 300 is 0 in 20-bit mode and 16-bit mode. It is 1 in 10-bit mode and 8-bit mode. The output signal of mux 310 is referred to as HALFCLK, although it will be appreciated that it has one-half the frequency of LFCLK_P only in 20-bit mode and 16-bit mode. In 10-bit mode and 8-bit mode HALFCLK has the same frequency as LFCLK_P.

The HALFCLK signal is applied to the clock input terminal of the input register circuitry 320 of byte serializer 170, and also to PCS circuitry 20 (to enable data output by circuitry 20 like CLK_DIVTX in FIG. 1). The HALFCLK signal is also applied to the second input terminal of OR gate 330. The output signal of OR gate 330 is applied to the selection control input terminal of mux circuitry 340.

Ten of the output signals of register circuitry 320 (i.e., from bit positions 0:9 of that register) are applied in parallel to the upper ten selectable input terminals of mux circuitry 340. The other ten output signals of register circuitry 320 (i.e., from bit positions 10:19 of the register) are applied in parallel to the lower ten selectable input terminals of mux circuitry 340. In 20-bit mode, all 20 bit positions of register 320 contain data from PCS 20. In 16-bit mode, bit positions 0:7 and 10:17 of register 320 contain data from PCS 20. In 10-bit mode, bit positions 0:9 of register 320 contain data from PCS 20. In 8-bit mode, bit positions 0:7 of register 320 contain data from PCS 20. From this description it will be apparent that in 10-bit mode and 8-bit mode mux 340 should always select its upper inputs. This will occur because in 10-bit and 8-bit modes the output of memory element 300 is 1, which makes the output of OR gate 330 1 regardless of the level of HALFCLK. On the other hand, in 20-bit mode and 16-bit mode, mux 340 should alternate between selecting its upper and lower inputs. This will occur because in 20-bit mode and 16-bit mode the output of memory element 300 is 0, which allows the alternating level of HALFCLK to toggle the output of OR gate 330 and thereby toggle the selection made by mux 340.

In 10-bit mode and 8-bit mode, data flows from registers 320 through the upper inputs of mux 340 to register 350.

Registers 320 and 350 are both clocked at the same rate, so data simply flows through byte serializer 170. In 20-bit mode and 16-bit mode, on the other hand, data flows to register 350 alternately from the upper and lower bit positions of register 320. This serializes the two bytes that register 320 stores in parallel. Register 350 is clocked at twice the rate that register 320 is clocked to accommodate this serialization of bytes. The circuitry downstream from register 350 in FIG. 2 can be similar to what is shown downstream from circuitry 170 in FIG. 1.

Figure 3:
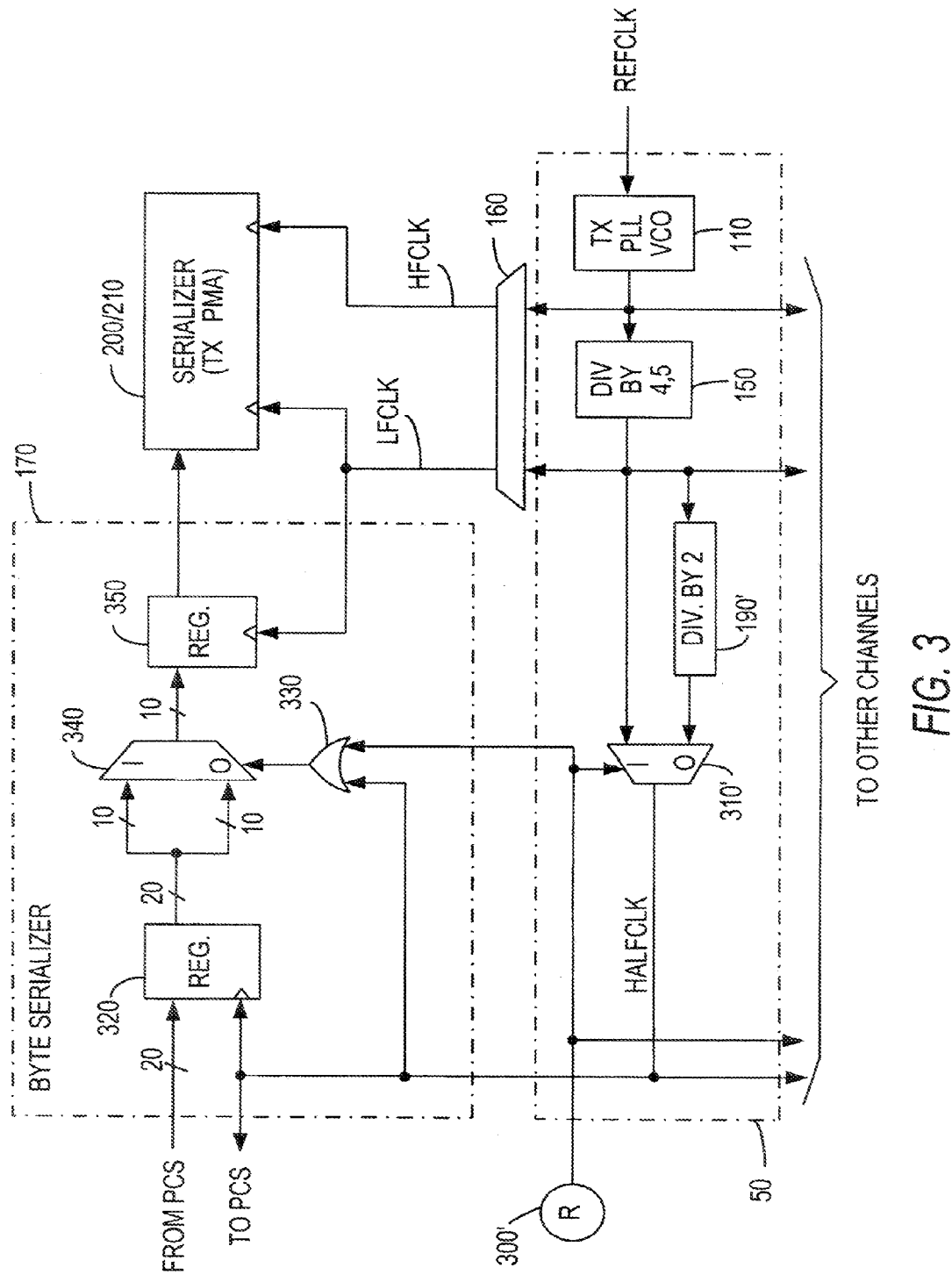
FIG. 3 is similar to FIG. 2 for certain other aspects of FIG. 1 in accordance with the invention.

Whereas FIG. 2 shows an illustrative embodiment of certain aspects of the FIG. 1 circuitry for X1-mode operation, FIG. 3 shows an illustrative embodiment of those aspects for X4-mode operation. In FIG. 3 elements 150, 190', and 310' are provided in CMU 50. Memory element 300' is associated with CMU 50. CMU elements 150, 190', 310', and 300' in FIG. 3 are respectively analogous to individual channel elements 130/140, 190, 310, and 300 in FIG. 2. The output signals of elements 110, 150, 310', and 300' are applied to all of the channels 10 associated with CMU 50. This allows all of those channels to work together in X4 mode as described earlier in this specification. The operation of all of the elements shown in FIG. 3 will be apparent from the earlier description of the same or analogous elements in FIGS. 1 and 2.

Preferred dynamic flip-flops for use in the circuitry of this invention are shown in Nguyen et al. U.S. Pat. No. 7,777,529.

It will be understood that the foregoing is only illustrative of the principles of the invention, and that various modifications can be made by those skilled in the art without departing from the scope and spirit of the invention. For example, the frequencies and bit rates mentioned herein are only examples, and other frequencies and/or bit rates can be used instead if desired. The number of communication channels 10 provided can be different than the numbers mentioned herein. Different numbers of communication channels 10 can be associated with each CMU 50. The use of pre-emphasis for the ultimate output signal is optional; and if pre-emphasis is provided, that can be done differently than has been described illustratively herein.

The invention claimed is:

1. Serializer circuitry on an integrated circuit comprising:
a plurality of channels of serializer circuitry, each of which employs a high frequency clock signal and a low frequency clock signal;
a reference clock signal source;
global clock generator circuitry for using an output signal of the reference clock signal source to produce a global high frequency clock signal and a global low frequency clock signal;
local clock generator circuitry associated with at least one of the channels for using an output signal of the reference clock signal source to produce a local high frequency clock signal and a local low frequency clock signal; and
selection circuitry associated with the at least one of the channels for selecting either the global high and low frequency clock signals or the local high and low frequency clock signals of that channel for employment by that channel as its high and low frequency clock signals.

2. The circuitry defined in claim 1 further comprising:
dynamic reconfigurable memory circuitry for controlling the selection made by the selection circuitry associated with the at least one of the channels.

3. The circuitry defined in claim 1 wherein a frequency ratio between the global high and low frequency clock signals is selectable.

4. The circuitry defined in claim 3 wherein a frequency ratio between the local high and low frequency clock signals associated with the at least one of the channels is selectable.

5. The circuitry defined in claim 4 further comprising:
dynamic reconfigurable memory circuitry for controlling the frequency ratio between the local high and low frequency clock signals associated with the at least one of the channels.

6. Serializer circuitry on an integrated circuit comprising:
a plurality of channels of serializer circuitry, at least one of which employs a high frequency clock signal and a low frequency clock signal;
a plurality of phase locked loop circuits, each of which can produce a respective one of a plurality of reference clock signals;
global clock generator circuitry for using one of the reference clock signals to produce a global high frequency clock signal and a global low frequency clock signal;
first selection circuitry associated with the at least one of the channels for selecting one of the reference clock signals;
local clock generator circuitry associated with at least one of the channels for using the local reference clock of that channel to produce a local high frequency clock signal and a local low frequency clock signal; and
second selection circuitry associated with the at least one of the channels for selecting either the global high and low frequency clock signals or the local high and low frequency clock signals of that channel for employment by that channel as its high and low frequency clock signals.

7. The circuitry defined in claim 6 further comprising:
dynamic reconfigurable memory circuitry for controlling the selection made by the first selection circuitry associated with the at least one of the channels.

8. An integrated circuit including multiple instances of serializer circuitry, each instance of serializer circuitry comprising:
a source of parallel data;
first multiplexer circuitry for receiving bits from even-bit positions in the parallel data and for outputting those even bits one after another in succession;
second multiplexer circuitry for receiving bits from odd-bit positions in the parallel data and for outputting those odd bits one after another in succession;
third multiplexer circuitry for receiving successive bits output by the first and second multiplexer circuitries and for alternately outputting those bits from the first and second multiplexer circuitries to produce a serial data output signal of the serializer circuitry, wherein each of the first and second multiplexer circuitries is controllable, by an output signal of memory circuitry on the integrated circuit, with respect to how many bits that first or second multiplexer circuitry receives in parallel from the source of parallel data;
a further source of parallel data, which can have width greater than the source of parallel data; and
fourth multiplexer circuitry for applying parallel data from the further source to the source, the fourth multiplexer circuitry being controllable by a further output signal of the memory circuitry, if the width of the further source data is greater than the source, to subdivide the data from the further source to subdivisions that the fourth multiplexer circuitry applies one after another in succession to the source.

9. The integrated circuit defined in claim 8 wherein each of the first and second multiplexer circuitries is controllable to receive either four or five bits from the source of parallel data.

10. The integrated circuit defined in claim 8 wherein each of the first and second multiplexer circuitries is controllable to output either four or five bits before receiving subsequent data from the source.

11. The integrated circuit defined in claim 8 wherein the width of the further source data can be up to 20 bits, and wherein the source can receive only up to 10 bits.

12. The integrated circuit defined in claim 8 further comprising:
   a source of a clock signal;
   circuitry for dividing frequency of the clock signal by a selectable factor to produce a high frequency clock signal; and
   circuitry for applying the high frequency clock signal to the third multiplexer circuitry for use in controlling which received bit that circuitry outputs.

13. The integrated circuit defined in claim 12 wherein the selectable factor is either four, two, or one.

14. The integrated circuit defined in claim 12 further comprising:
   further circuitry for dividing frequency of the high frequency clock signal by a further selectable factor to produce a low frequency clock signal; and
   circuitry for applying the low frequency clock signal to the first and second multiplexer circuitries for use in controlling when those circuitries receive bits from the source.

15. The integrated circuit defined in claim 14 further comprising:
   dynamic reconfigurable memory circuitry for controlling the further selectable factor.

16. The integrated circuit defined in claim 12 further comprising:
   dynamic reconfigurable memory circuitry for controlling the selectable factor.

17. The integrated circuit defined in claim 14 wherein the further selectable factor is either four or five.

18. The integrated circuit defined in claim 8 further comprising:
   phase-locked loop circuitry for producing a central clock signal;
   circuitry for distributing the central clock signal to a plurality of the multiple instances of serializer circuitry;
   local clock generator circuitry within each of the plurality of instances of serializer circuitry for using the central clock signal as a basis for a local clock signal;
   global clock generator circuitry for using the central clock signal as a basis for a global clock signal;
   circuitry for distributing the global clock signal to each instance in the plurality of instances of serializer circuitry; and
   selection circuitry within each instance in the plurality of instances of serializer circuitry for selecting either the global clock signal or the local clock signal of that instance of serializer circuitry for use as a basis for a clock signal that is applied to at least one of the multiplexer circuitries in that serializer circuitry.

19. The integrated circuit defined in claim 8 further comprising:
   dynamic reconfigurable memory circuitry for controlling the first and second multiplexer circuitries.

20. The integrated circuit defined in claim 8 further comprising:
   dynamic reconfigurable memory circuitry for controlling the fourth multiplexer circuitry.

* * * * *